United States Patent [19]

Shikata

[11] Patent Number: 5,088,062
[45] Date of Patent: Feb. 11, 1992

[54] MEMORY DEVICE HAVING COMMON DATA LINES FOR READING AND WRITING

[75] Inventor: Michiharu Shikata, Kusatsu, Japan

[73] Assignee: Matsushita Electronics Corporation, Osaka, Japan

[21] Appl. No.: 493,683

[22] Filed: Mar. 15, 1990

[30] Foreign Application Priority Data

Mar. 15, 1989 [JP] Japan .................................. 1-62534

[51] Int. Cl.$^5$ ...................... G11C 7/00; G11C 11/409
[52] U.S. Cl. .......................... 365/189.05; 365/189.04; 365/238.5
[58] Field of Search ............... 365/233, 233.5, 189.05, 365/189.02, 238.5, 189.04, 230.02

[56] References Cited

U.S. PATENT DOCUMENTS 4,633,429 12/1986 Lewandowski et al. ....... 365/189.05
4,789,960 12/1988 Willis .......................... 365/189.05 X
4,899,310 2/1990 Baba et al. ...................... 365/189.05
4,935,897 6/1990 Kurihara et al. ............... 365/189.05
4,954,987 9/1990 Auvinen et al. ................ 365/230.02
5,003,475 3/1991 Kerber et al. ............... 365/230.02 X Primary Examiner—Alyssa H. Bowler
Attorney, Agent, or Firm—Wenderoth, Lind & Ponack

[57] ABSTRACT

A semiconductor memory device includes a memory cell array having plural memory cells disposed in an array. A sense amplifier is provided for selecting a plurality of memory cells from among the plural memory cells of the memory cell array. Data lines are provided coupled to the sense amplifier. Each of the data lines is for transmitting write data to and read data from the memory cell array. A read data latch circuit is provided having a plurality of latch circuits respectively coupled to the data lines. Additionally, a write data latch circuit is provided having a plurality of buffer circuits respectively coupled to the data lines. Thus, a common transmitting path is provided for both inputting data and outputting data from the memory cell array. Upon carrying out a write operation for writing of the write data into the memory cell array, the write data is stored in both the read data latch circuit and the write data latch circuit at the same time.

20 Claims, 11 Drawing Sheets

MEMORY DEVICE HAVING COMMON DATA LINES FOR READING AND WRITING

BACKGROUND OF THE INVENTION

The present invention relates to a memory device incorporated in a semiconductor device.

The recent trend of increased capacity, better performing and functionally superior semiconductor memory devices is striking, and the range of applicable use of such devices seems infinite. Against this background, requirements for advanced and high speed memories are rapidly becoming more prevalent as represented, for example, by the popularity of superhigh-speed large-sized computers and high performance work stations, the development of 32-bit personal computers, and applications in the video arts. To satisfy such requests for higher speed large-capacity memories, it is essential to increase the circuit technology speed, as well as to increase the device technology.

As for the circuit technology, particularly in the dynamic random access memory (DRAM), high speed access mode functions such as page mode, nibble mode and serial mode are proposed and realized. Such access mode functions which increase the speed using circuit technology which is presumed to be more important henceforth.

As a conventional semiconductor memory device, hereinafter, an example of a DRAM having an increased in memory speed using the nibble mode function is illustrated below.

FIG. 8 is a block diagram of a conventional DRAM data reading and writing circuit having an increased memory speed using the nibble mode function, FIG. 9 is a detailed circuit diagram of essential portions of the circuit shown in FIG. 8, FIG. 10 is a block diagram of an internal signal generating circuit for driving the circuits shown in FIG. 8 and FIG. 9, and FIG. 11 depicts voltage waveform diagrams at each node in the circuits shown in FIG. 8, FIG. 9, and FIG. 10.

Referring to FIG. 8, a row address buffer 1 and a column address buffer 2 generate an internal row address signal and an internal column address signal, depending on the address signal input provided at the individual address input terminals. A row decoder 3 and a word line driver 4, responding to the internal row address signal, select one of the plural word lines, and choose the memory cells one line from a memory cell array 5 arranged in a matrix form of rows and columns. A sense amplifier 6, when reading out the data, amplifies the data being read out from the memory cell connected to the selected word line, and latches on the bit line which corresponds a row line. Furthermore, a column decoder 7, in response to the internal column address signal, selects a necessary number (four, in this example) of bit lines out of the plural bit lines, and transfers the data on the selected bit lines to data lines.

Data lines are provided in four pairs. Each data line is composed of two mutually complementary signal lines (when one is at high level, the other is at low level), that is, DL1, $\overline{DL1}$; DL2, $\overline{DL2}$; $\overline{DL3}$, DL3; DL4, $\overline{DL4}$. When reading out data, data latch 8 shown in FIG. 8 is responsible for amplifying the data transferred from the bit line selected by the column decoder 7 to the data line, and latching the data on the data line. This data latch 8 is composed of four latch circuits 9 to 12 corresponding to each pair of the data lines, and these latch circuits 9 to 12 are composed of differential amplifiers, such as dynamic flip-flops. A selector 14 selects an arbitrary one of the four pairs of data lines, and exchanges data between a data input buffer 13 or data output buffer 15, and the selected data line. A counter 16 provides address information for determining the selection of the data line in the selector 14, and it is mainly composed of a two-bit binary counter for counting by starting from the two-bit address signal corresponding to each bit of the row address and column address of the internal address signal generated by the row address buffer 1 and column address buffer 2.

FIG. 9 shows a detailed circuit composition of the data latch 8 and selector 14 which are particularly closely related with the realization of the nibble mode function in the shown in FIG. 8.

The selector 14 is composed of MIS transistors Q1 to Q16 and logic gates G1 to G4. Depending on the output signals C1 to C4 and internal write control signal W of the counter 16 shown in FIG. 8, control signals W1 to W4 are generated from the logic gates G1 to G4. On the basis of these control signals W1 to W4, in the write mode, the data D1, $\overline{D1}$ generated in the data input buffer 13 shown in FIG. 8 are transferred to the selected data lines through the transistors Q1 to Q8, and in the read mode, the data D0, $\overline{D0}$ are supplied into the data output buffer 15 shown in FIG. 8, through the transistors Q9 to Q16.

The circuits shown in FIG. 8 and FIG. 9 are driven by the clock signals generated by the internal clock generating circuit shown in FIG. 10. The internal clock generating circuit shown in FIG. 10 is composed of clock generators 17 to 19, address transition detector 20, and logic gate G5.

$\overline{RAS}$, $\overline{CAS}$, $\overline{WE}$ and the address signal input are signals provided from external the memory device. $\overline{RAS}$ is a reference clock signal for driving the row address buffer 1, row decoder 3, word line driver 4, sense amplifier 6 and data latch 8 shown in FIG. 8. $\overline{CAS}$ is a reference clock signal for driving the column address buffer 2, column decoder 7, selector 14, counter 16, data input buffer 13 and data output buffer 15 in the active period of $\overline{RAS}$ (while $\overline{RAS}$ is at low level as mentioned later). $\overline{WE}$ is a signal for specifying whether the memory device is in read mode or in the write mode, and practically, in read mode, by the clock generator 18, the internal reading control signal (clock signal) R is set in an active state (high level), and in the write mode, the internal writing control signal (clock signal) W is set in an active state (high level).

In thus composed semiconductor memory device (DRAM in this conventional example), the nibble mode operation is described below while referring to the timing charts shown in FIG. 11, and the circuit diagrams shown in FIGS. 8, 9, 10.

The nibble mode function is as shown in the timing chart of FIG. 11. That is, by feeding the second reference clock signal $\overline{CAS}$ plural times (in other words, by setting $\overline{CAS}$ at low level plural times as shown, or four times in FIG. 11, t4 to t5, t6 to t7, t8 to t9, t10 to t11) in the active period of the first reference clock signal $\overline{RAS}$ (that is, while the $\overline{RAS}$ is at low level), the data is read out or written in at a high speed at every input of $\overline{CAS}$. At this time, the designation of the memory cell subjected to reading or writing at every input of $\overline{CAS}$, that is, the designation of row and column addresses, is sufficient only with the designation of the row address by the address input signal in the active state of $\overline{RAS}$ [in other words, in the fall of $\overline{RAS}$ (time t1)], and the designation of the column address at the time of the first input of $\overline{CAS}$ (time t4). At the time of the subsequent $\overline{CAS}$ input, without designation of the address by the address signal input, only by the designation of the output signals C1 to C4 of the counter 16 in the memory device, reading and writing is executed sequentially in the four memory cells corresponding to four bits starting with the address specified at the time of the first $\overline{CAS}$ input. In particular, as for the reading of data of every input of $\overline{CAS}$, the data already latched in the data latch 8 is selected by the counter 16 and selector 14, and it is sufficient to transfer to the data output buffer 15. Therefore, unlike the ordinary reading, since it is not necessary to operate the column decoder or data latch by newly specifying the column address, the memory speed may be notably higher. In the example of FIG. 11, $\overline{CAS}$ input is made four times in the $\overline{RAS}$ active period, and the first time and third time are data writing, and second time and fourth time are data reading. First, at time t1, $\overline{RAS}$ becomes a low level, and the row address buffer 1, row decoder 3, sense amplifier 6 and others are put into action, and the data from the memory cells are latched on the bit lines. Next, at time t2, receiving selection of bit lines by the column decoder 7 and data transferred to data lines, the data latch driving signal PE is activated at time t3, and the data latch 8 is actuated. As a result, data is latched in the data lines DL1, $\overline{DL1}$ to DL4, $\overline{DL4}$. Next, a first $\overline{CAS}$ is fed (time t4). At this time, the write control signal $\overline{WE}$ is at low level, that is, the $\overline{CAS}$ cycle is specified in a data write cycle, and therefore, correspondingly, the internal write control signal W is activated, thereby becoming a high level. By contrast, at the time of the second $\overline{CAS}$ input (time t6), since the write control signal WE is at high level, this cycle becomes a data read cycle, and the internal read control signal R is activated. On the other hand, as for the output signals C1 to C4 of the counter 16 for controlling the quarter selector 14, first, according to the designation of the column address determined at time t2, at the time of the first $\overline{CAS}$ input (time t4), the output signal C1 is already in an active state (high level), and on every occasion of the subsequent $\overline{CAS}$ inputs (time t5, t7, t9), the output signals C2, C3, C4 are sequentially activated. Thus, at the time of the first $\overline{CAS}$ input (time t4), the internal write control signal W and output signal C1 are in an active state. In consequence, by the action of the logic gate in FIG. 9, the control signal W1 becomes a high level, and the transistors Q1, Q2 are made to conduct, and the write data is written in data lines DL1, $\overline{DL1}$, and is further written into the memory cells through bit lines. By contrast, at the time of the second $\overline{CAS}$ input (time t6), the internal write control signal W is in an inactive state, while the internal read control signal R and output signal C2 are in an active state. As a result, by the internal read control signal R, the data output buffer 15 in FIG. 8 becomes ready to act, and the data D0, $\overline{D0}$ transferred to the data output buffer 15 through transistors Q11, Q12 in FIG. 9 (the data being latched in DL2, $\overline{DL2}$ at time t3) are read out at the data output terminal as the read data output. The operation at the time of the third and fourth $\overline{CAS}$ inputs is basically same as in the first and second inputs, except that the states of C1 to C4 are different, and a detailed explanation thereof is omitted.

Thus, in the conventional semiconductor memory device, at the time of the second and subsequent inputs of the reference clock corresponding to $\overline{CAS}$, the address signal input is omitted, and the data latched on plural pairs of data lines can be delivered by synchronizing with the reference clock sequentially by the counter 16 and the selector 14 driven by the output signals C1 to C4 of the counter 16, the data reading speed is markedly increased.

However, with regard to the writing of data, there is no substantial difference from the operation in the ordinary mode, and a high speed writing operation is not expected using the access mode functions, such as the nibble mode. In other words, in the conventional circuit composition, writing of data requires transfer of data from the data input buffer 13 to the selector 14, data lines, sense amplifier 6, bit lines, and the memory cell directly. Therefore, all loads, such as floating loads parasitizing these circuit blocks, must be handled by the data input buffer 13 alone so as to drive all these circuit blocks. Since the loads tend to increase as the memory capacity becomes larger, they are substantial barriers against increasing the speed of the memory write action. Hence, in order to keep a sufficient writing time, it is required to maintain the input cycle time of the reference clock in a high speed mode over a specific period, and the action time of the memory is regulated by the data write time. Thus, in the semiconductor memory device of the conventional structure, an increase in the memory speed is limited by the data write speed.

It is hence a primary object of the present invention to solve the problems of the prior art and to present a high speed memory device having a sufficient timing margin.

SUMMARY OF THE INVENTION

The present invention relates to a circuit composition for realizing a high speed semiconductor memory operation such as in a nibble mode, which includes plural latch circuits for data writing, a circuit for storing the data writing history into the plural latch circuits and controlling data writing operations to plural memory cells on the basis of the result thereof, and a circuit for writing the write data latched in the plural latch circuits into the plural memory cells in batch during the inactive period of the reference clock signal for driving the memory device.

According to the above circuit composition, not only is the data reading speed increased, but the data writing operations may also be carried out at a high speed, so that a high speed operation of the memory device may be realized on the whole.

Other objects and features of the invention, as well as the benefits and advantages thereof, will be better understood and appreciated from the following detailed description taken in conjunction with the accompanying drawings.

DETAILED DESCRIPTION OF THE INVENTION

Figure 1:
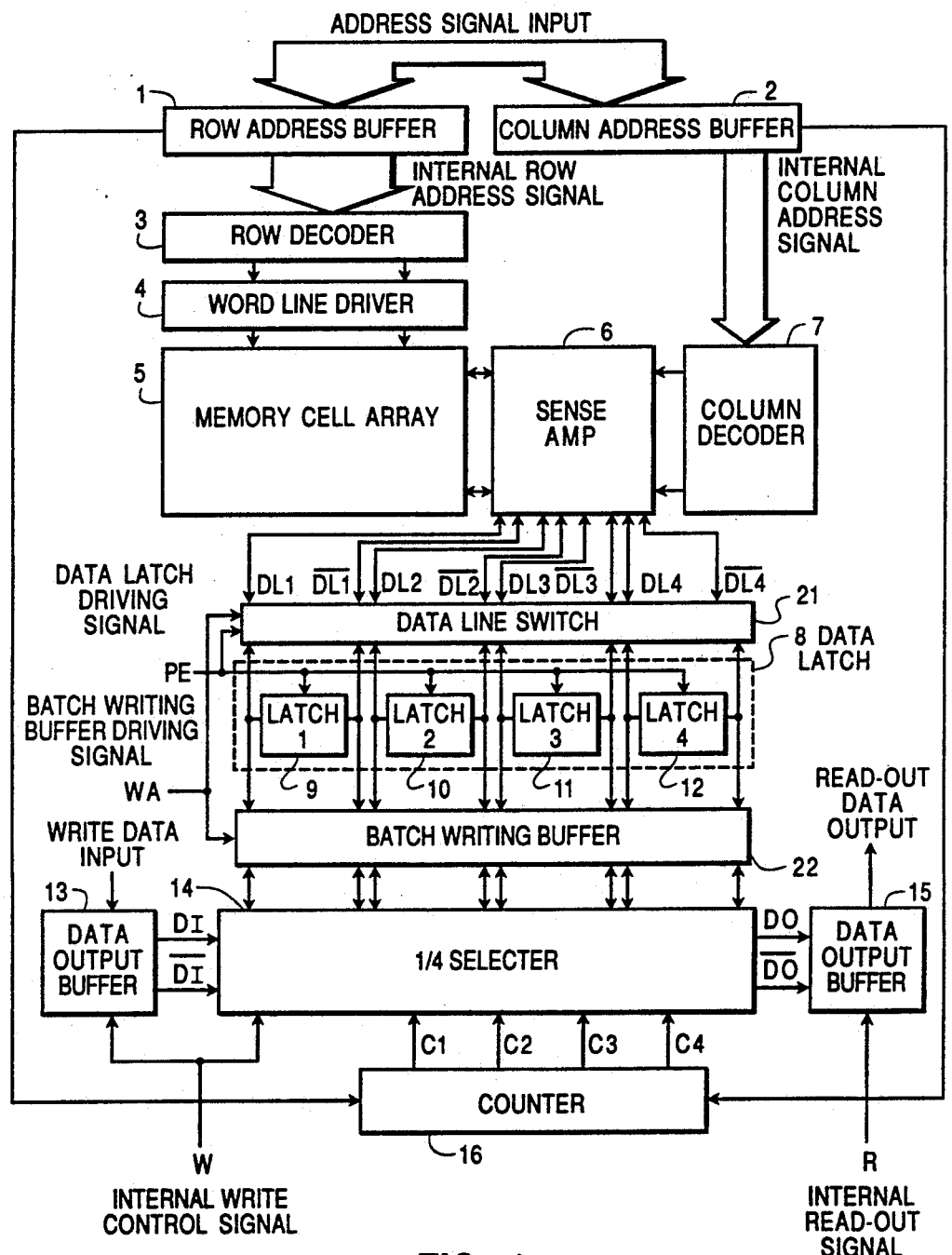
FIG. 1 is a block diagram of data reading and writing circuits of a semiconductor memory device in a first embodiment of the present invention.

Referring now to the drawings, the first embodiment of the invention is described below in detail. As in the prior art example, the first embodiment of the present invention is also represented by an example of a DRAM increased in speed using the nibble mode function.

FIG. 1 is a block diagram of data reading and writing circuits of a semiconductor memory device in the first embodiment of the present invention which is designed to increase the memory speed using the nibble mode function.

Figure 8:
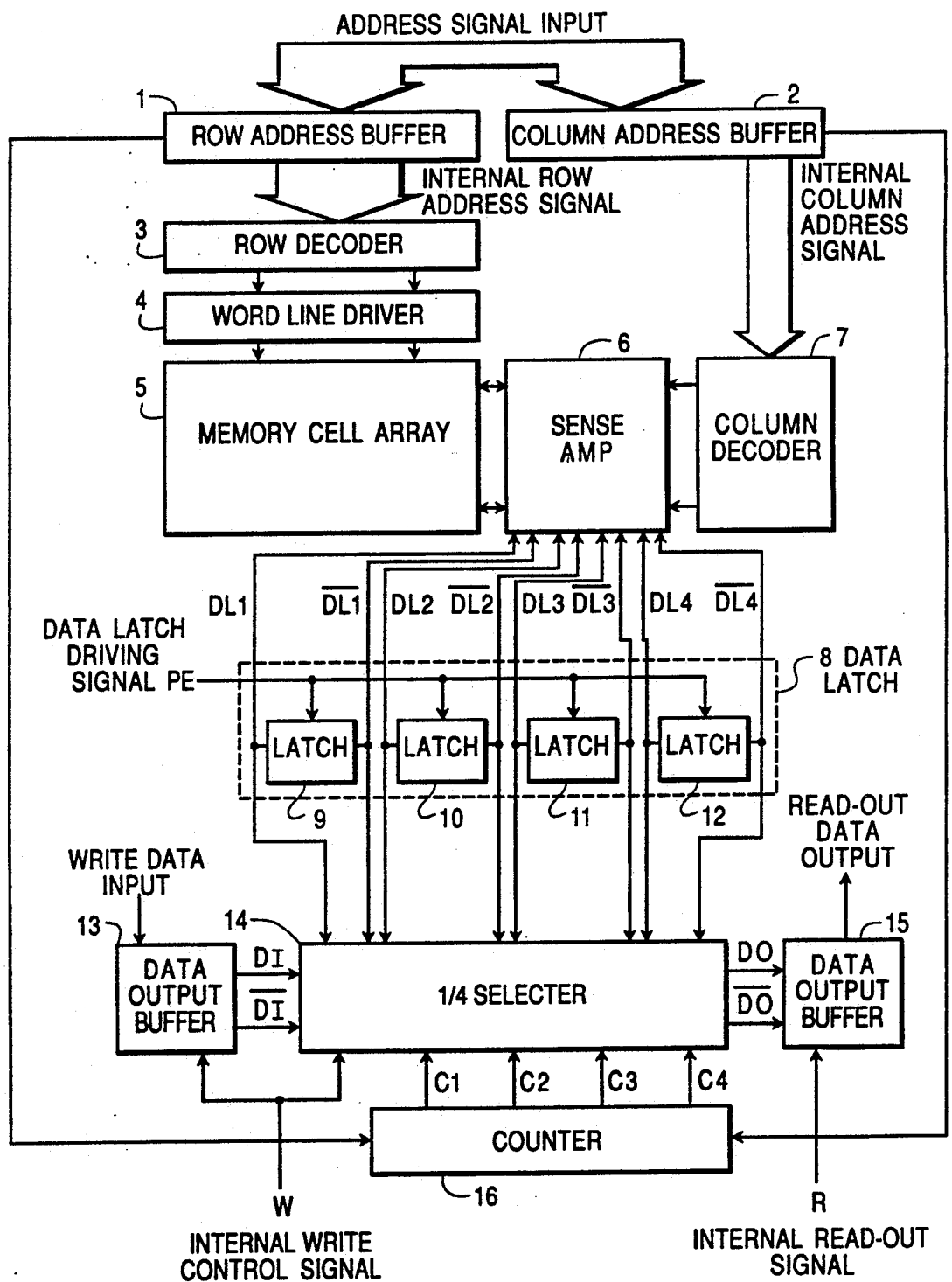
FIG. 8 is a block diagram of data reading and writing circuits of a conventional semiconductor memory device.

Shown in FIG. 1, the row address buffer 1, column address buffer 2, row decoder 3, word line driver 4, memory cell array 5, sense amplifier 6, column decoder 7, data latch 8, composed of latch circuits 9 to 12, data input buffer 13, selector 14, data output buffer 15, and counter 16 are identical with the corresponding circuits shown in FIG. 8. The distinction between the circuit composition in FIG. 1 and the prior art in FIG. 8 is as follows: (1) a data line switch 21 is provided as shown in FIG. 1 to temporarily separate the data lines of four pairs connected to the data latch 8, from the data lines connected to the sense amplifier 6 or bit lines connected to the memory cell array 5, and (2) a batch writing buffer 22 is provided as shown in FIG. 1, aside from the data latch 8, on the data lines separated by the data line switch 21. The batch writing buffer 22 is driven by the batch writing buffer driving signal (internal clock signal) WA, and the data line switch 21 is driven by the data latch driving signal PE and batch writing buffer driving signal WA.

Figure 2:
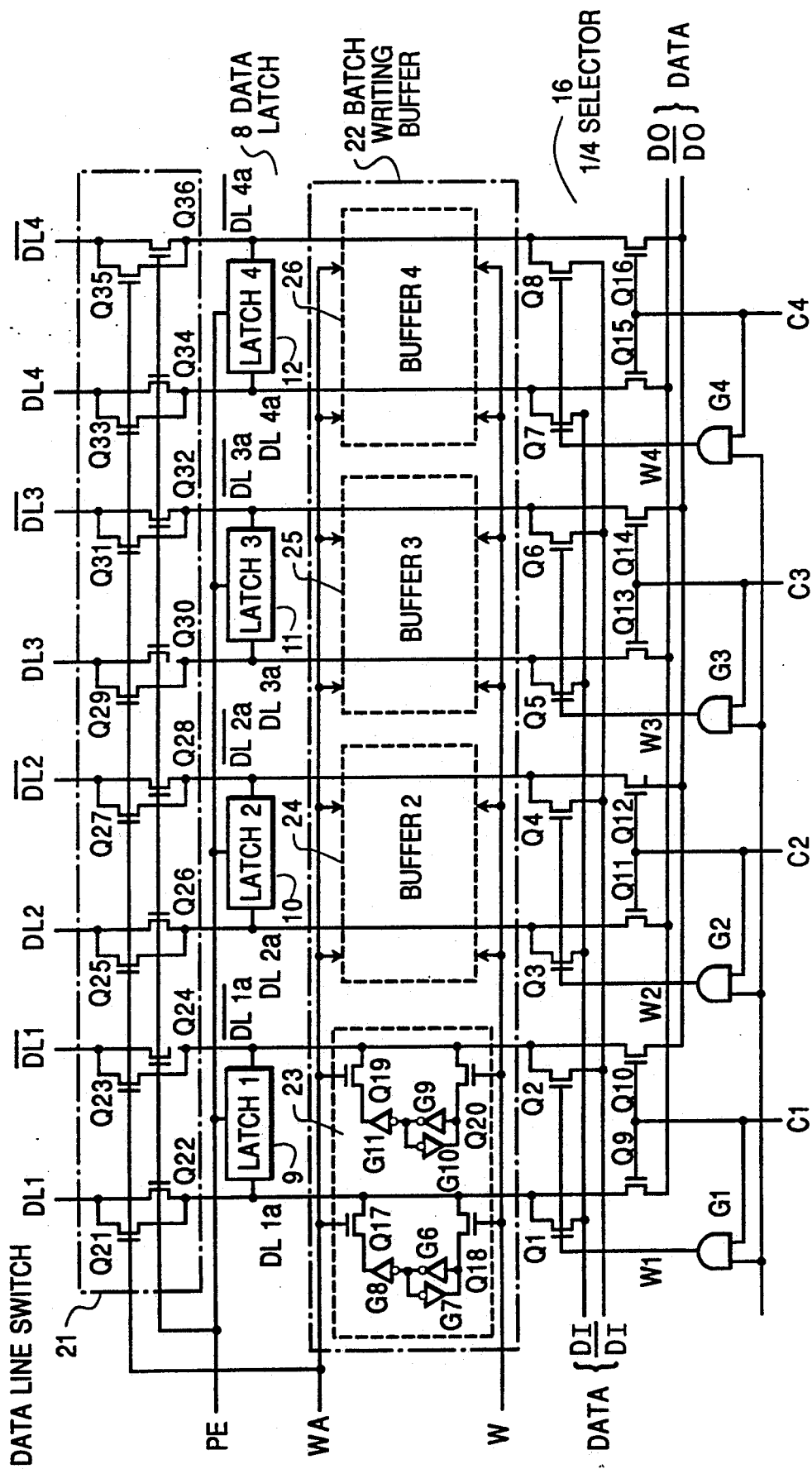
FIG. 2 is a detailed circuit diagram of principal parts of FIG. 1.
Figure 3:
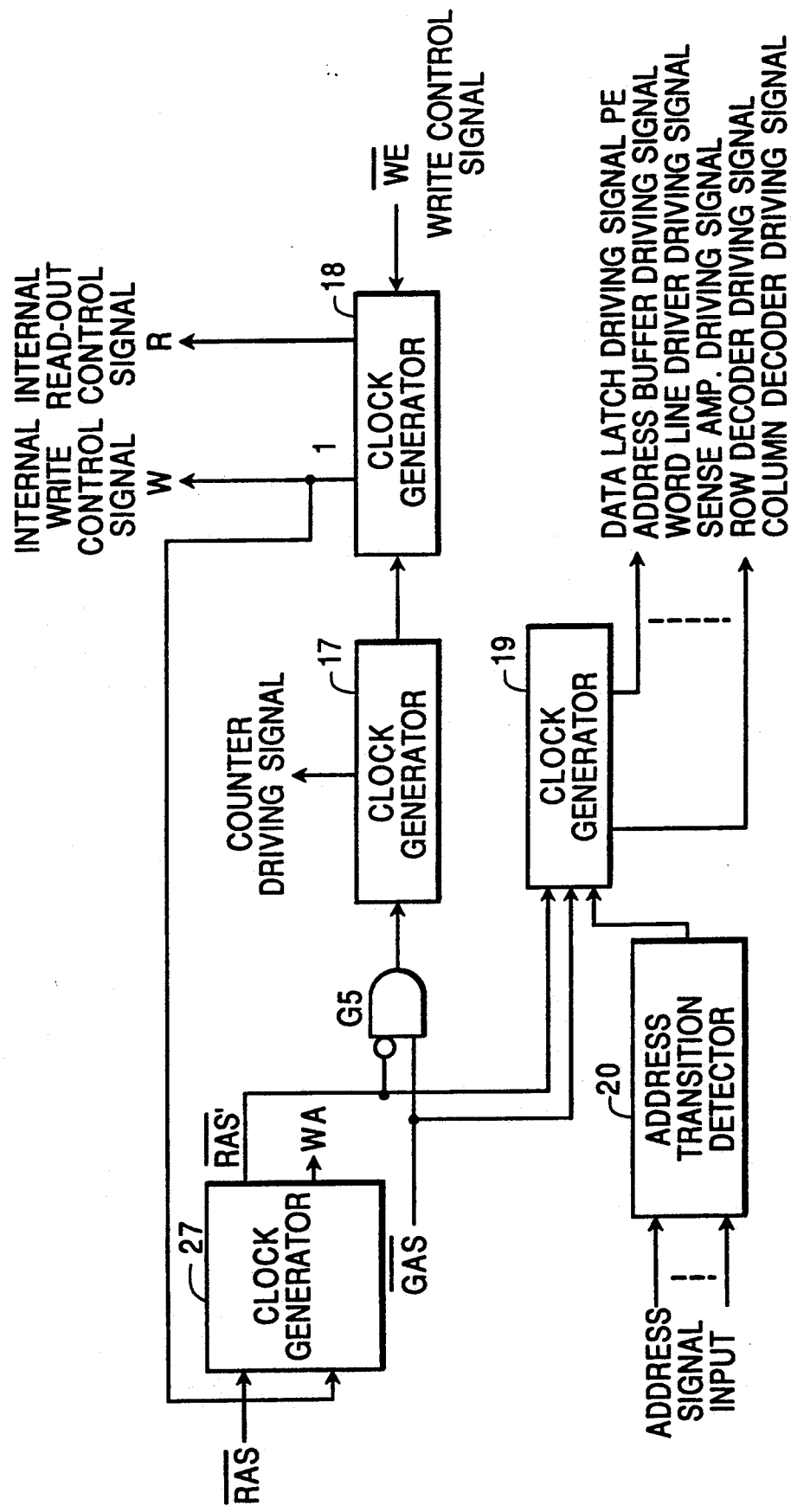
FIG. 3 is a block diagram of an internal clock signal generating circuit for generating driving signals of circuit blocks shown in FIG. 1.
Figure 4:
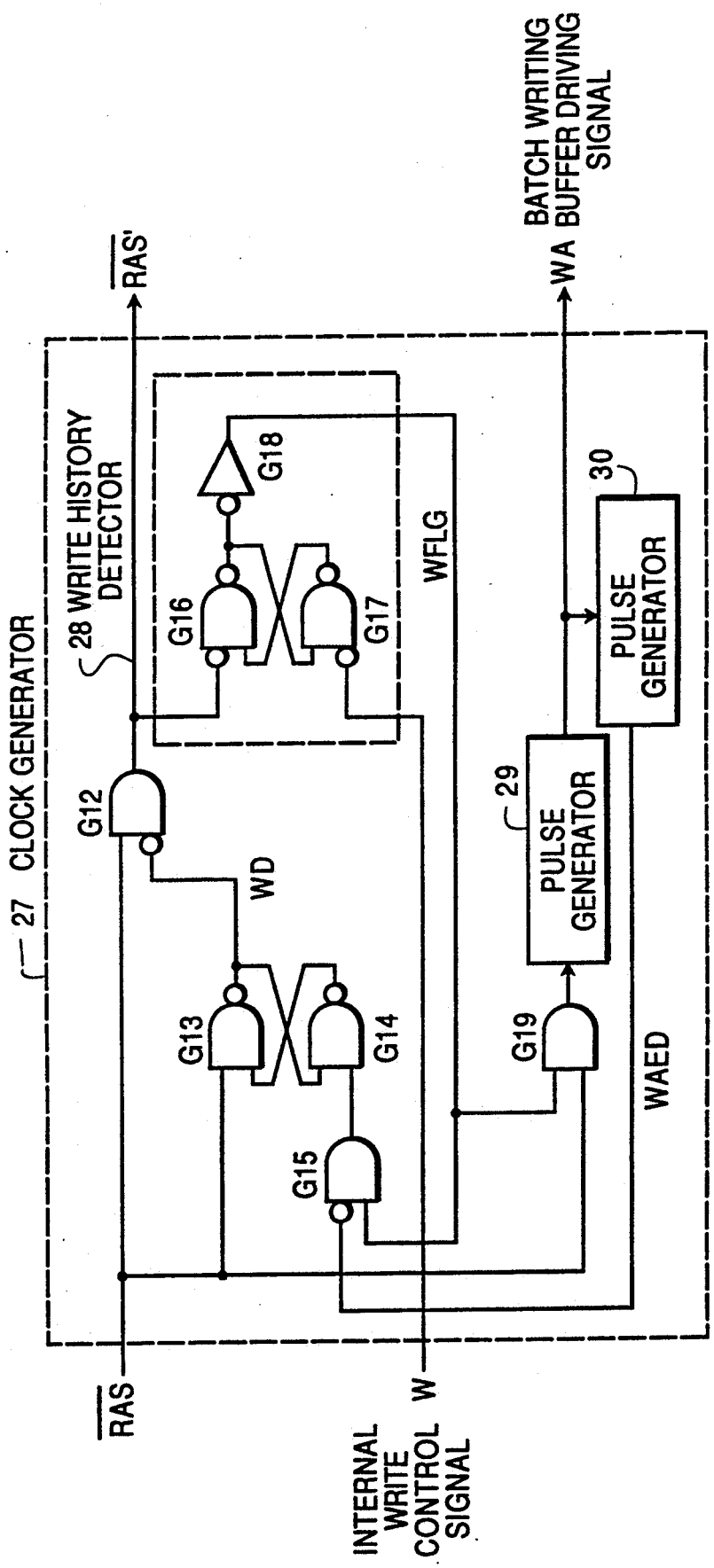
FIG. 4 is a detailed circuit diagram of the clock generator shown in FIG. 3.
Figure 9:
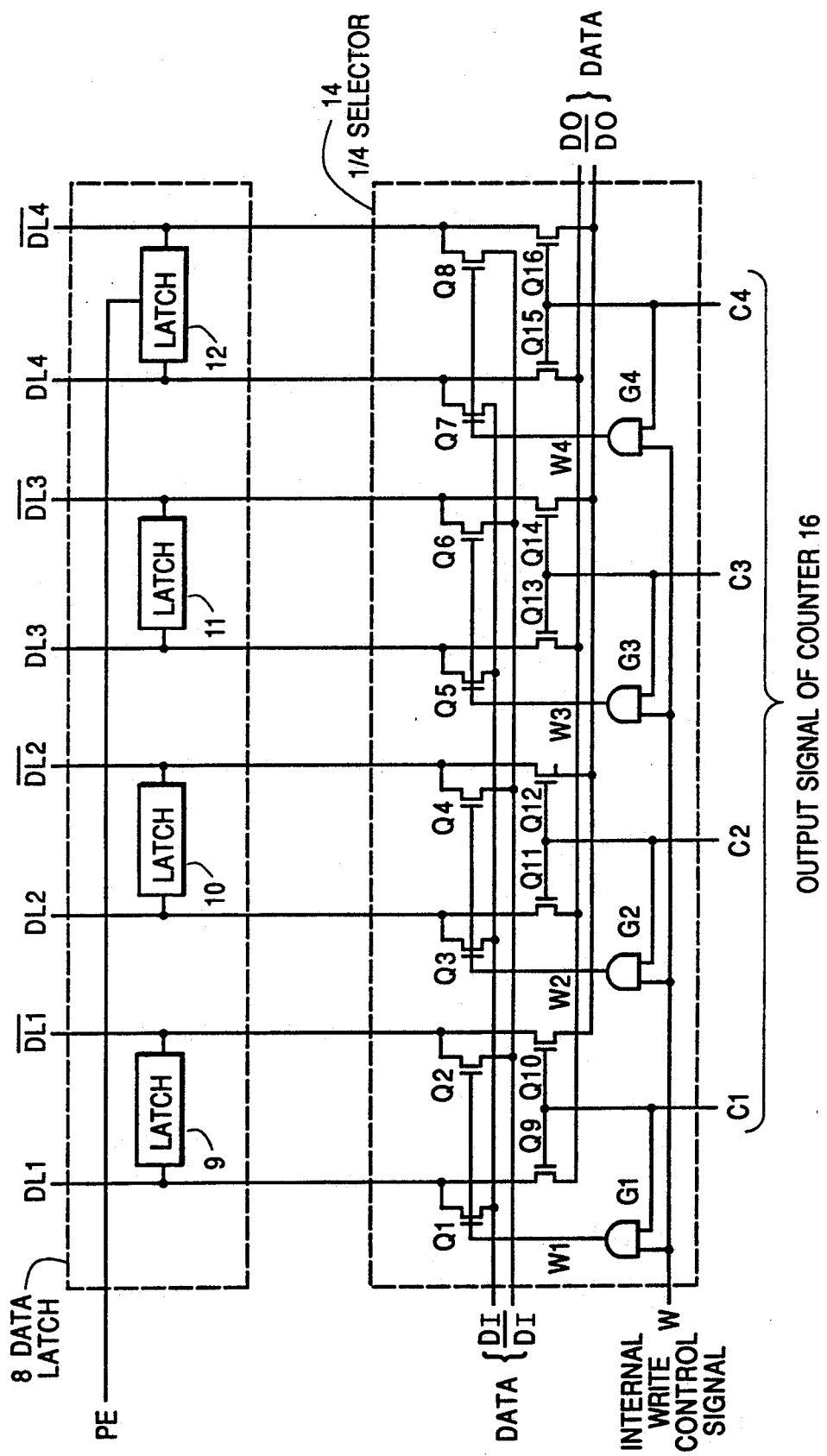
FIG. 9 is a detailed circuit diagram of principal parts of FIG. 8.
Figure 10:
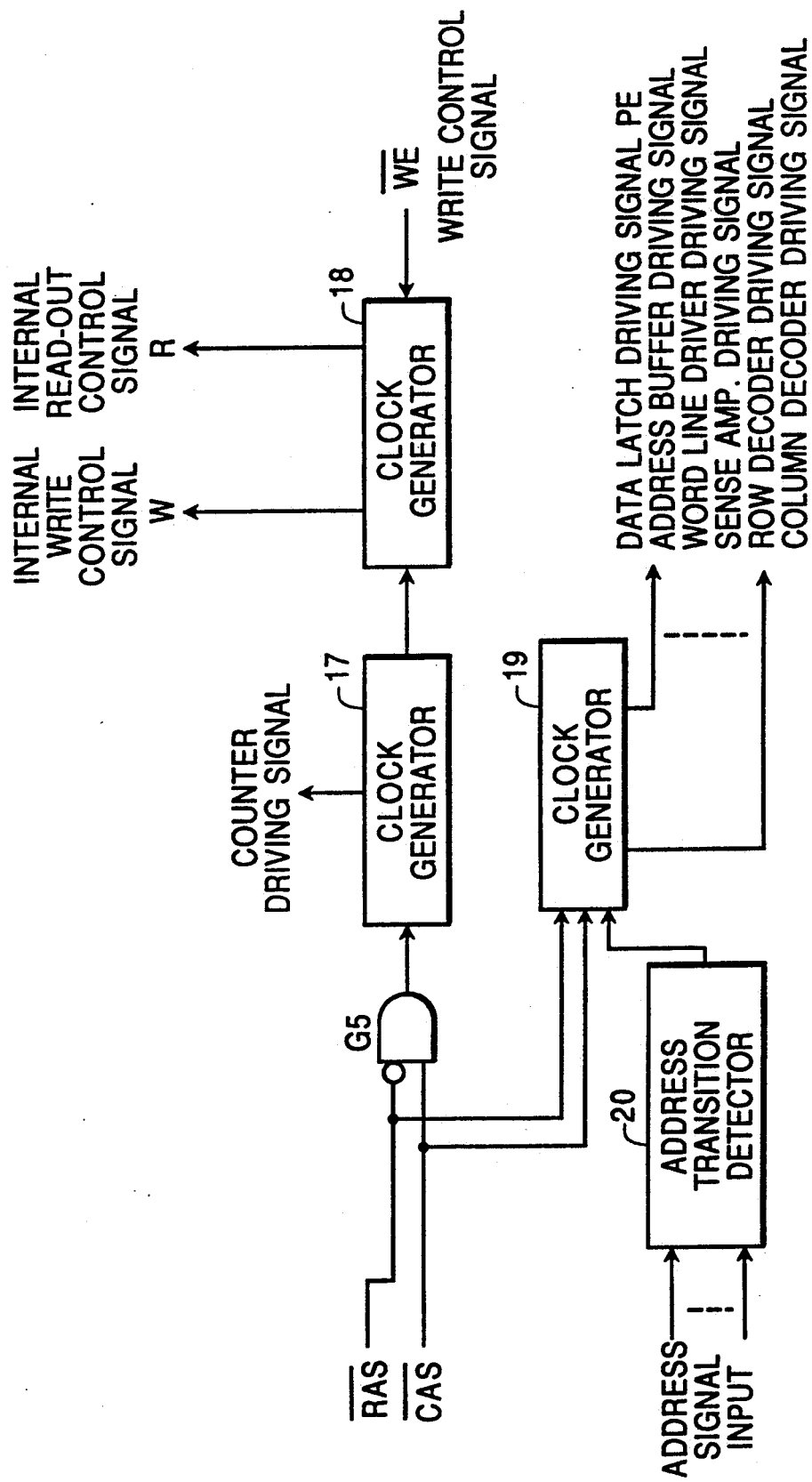
FIG. 10 is a block diagram of an internal clock signal generating circuit for generating driving signals of circuit blocks shown in FIG. 8.
Figure 11:
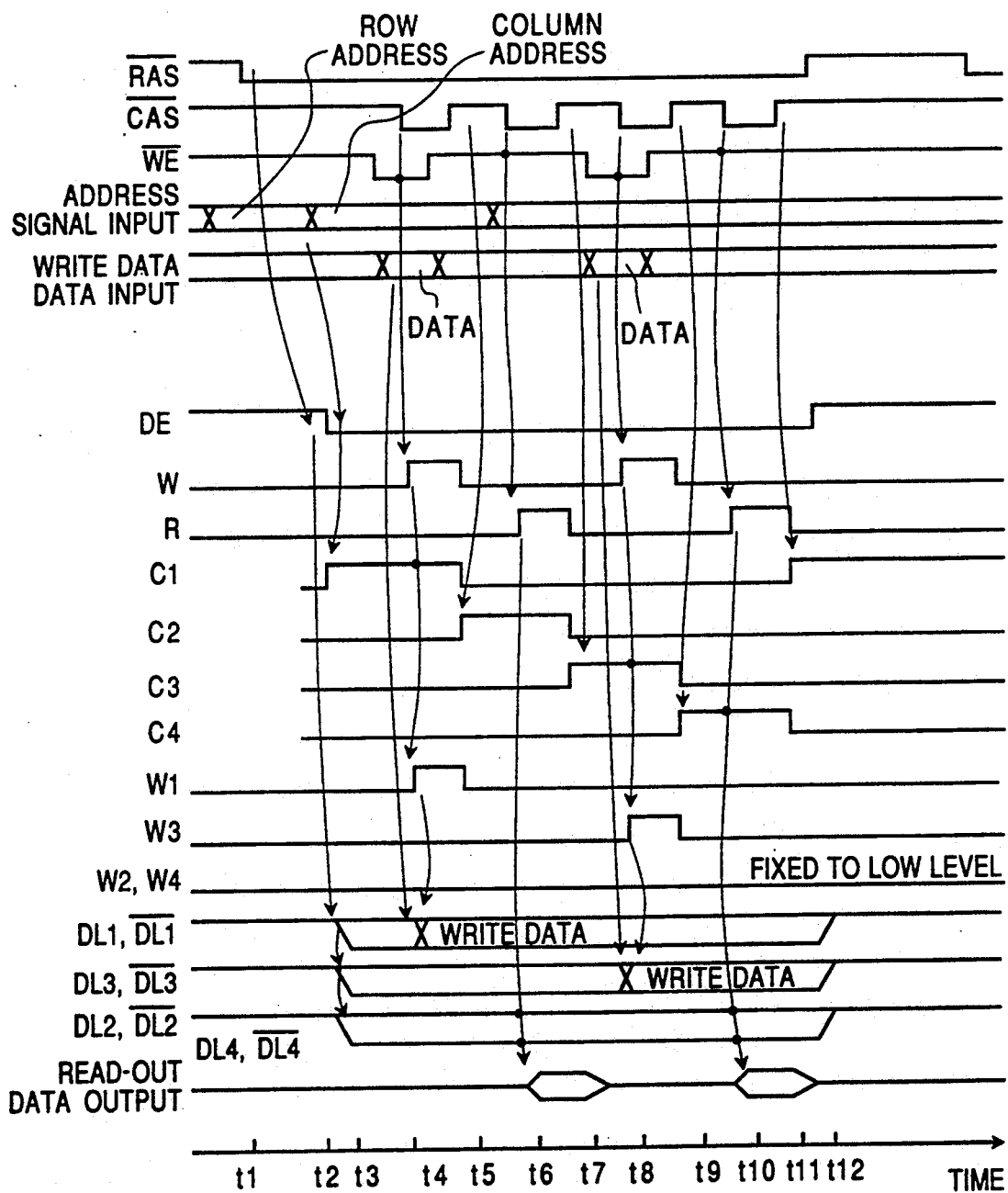
FIG. 11 shows voltage waveform diagrams of each node in FIG. 8.

FIG. 2 shows a detailed circuit composition including the data latch 8, selector 14, and newly added data line switch 21 and batch writing buffer 22 shown in FIG. 1. As understood from FIG. 2, the data latch 8 and the selector 14 are the same as in the conventional circuit composition shown in FIG. 9. In FIG. 2, DL1, $\overline{DL1}$ to DL4, $\overline{DL4}$ denote four pairs of data lines connected to the column decoder 7, sense amplifier 6 and others. Meanwhile, DL1a, $\overline{DL1a}$ to DL4a, $\overline{DL4a}$ are data lines separated by the data line switch 21, to which the data latch 8 and batch writing buffer 22 are connected. The data line switch 21 is composed of MIS transistors Q21 to Q36, and the data lines are separated when the data latch driving signal PE is at a low level (active state), and the batch writing buffer driving signal WA is at a low level (inactive state). The batch writing buffer 22 is composed of buffers 23 to 26 connected to the data lines. Each one of the buffers 23 to 26 is composed of inverters G6 to G11 and transistors Q17 to Q20 (in FIG. 2, for the sake of simplicity, only the buffer 23 is described in detail, and the detailed circuit configurations of buffers 24 to 26 are omitted). This batch writing buffer 22, when the internal write control signal W is at a high level (active state), latches the data on the data lines to which the buffers 23 to 26 are connected, in the buffers 23 to 27, on the data lines DL1a, $\overline{DL1a}$ to DL4a, $\overline{DL4a}$, and when the batch writing buffer driving signal WA is at a high level (active state), it functions as the buffer to drive the data lines at a low impedance. The structure of the internal clock signal generating circuit for driving the circuits shown in FIG. 1 and FIG. 2 is shown in FIG. 3 and FIG. 4. In FIG. 3 and FIG. 4, clock generators 17 to 19, address transition detector 20, logic gate G5, $\overline{RAS}$, $\overline{CAS}$, $\overline{WE}$ and address signal input are all signals applied from external the memory device, and are identical with the composition of the prior art example shown in FIG. 10. The clock generator 27 shown in FIG. 3 is newly added in this embodiment, and generates the batch writing buffer driving signal WA shown in FIG. 1 and FIG. 2. FIG. 4 shows a further detailed circuit composition of the clock generator 27. As shown in FIG. 4, the clock generator 27 is composed of logic gates G12 to G19, and pulse generators 29, 30, and a write history detector 28 is composed of logic gates G16 to G18.

In the thus composed DRAM, the operation in the nibble mode is explained below with reference to the circuit diagrams shown in FIGS. 1, 2, 3, and the timing charts of FIGS. 5, 6.

Figure 5:
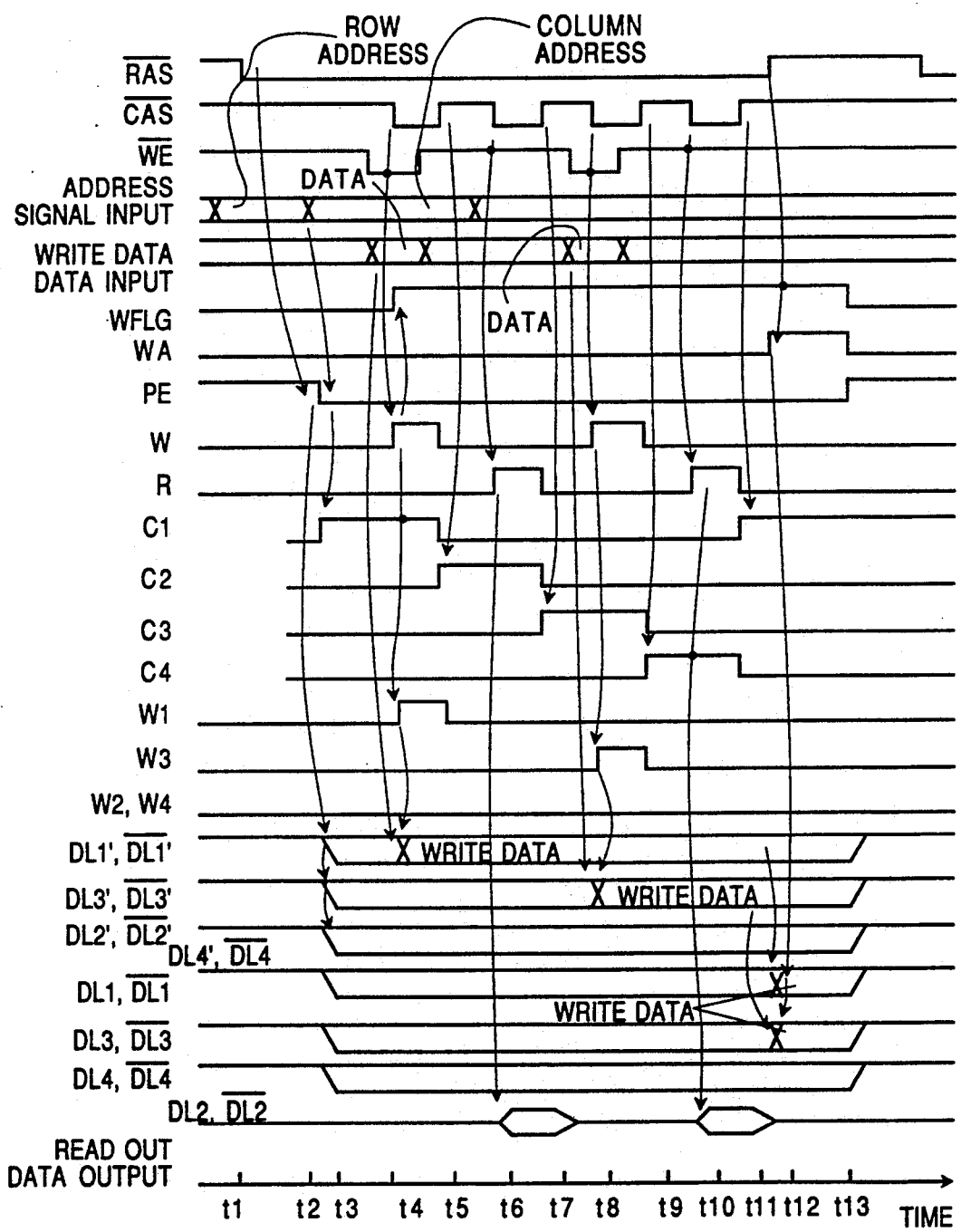
FIG. 5 shows voltage waveform diagrams of each node in FIG. 1.
Figure 6:
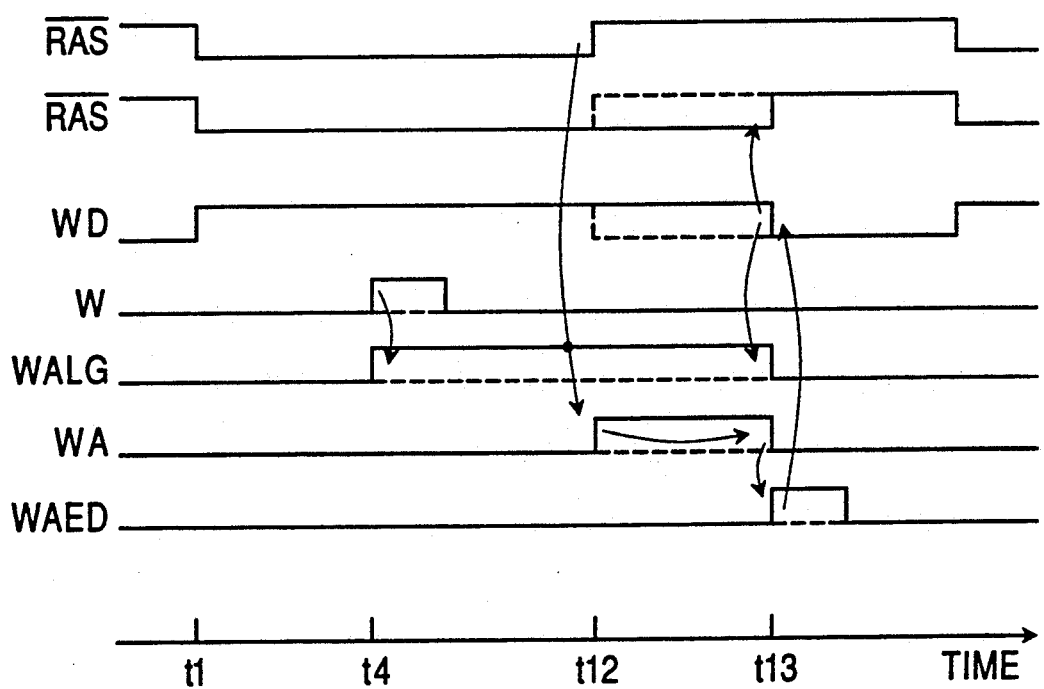
FIG. 6 shows voltage waveform diagrams of each node in FIG. 1.

In FIG. 5, as in the above description of the prior art, the $\overline{CAS}$ input is made four times in the $\overline{RAS}$ active period, and the first time and third time are for data writing, and the second and foruth time are for data reading. Additionally, of the clock signals for driving the circuits shown in FIG. 1 and FIG. 2, the action of the signals having the common name as in the prior art are the same as in the prior art, except for the data latch driving signal PE, and the operation upon data reading is also the same as in the prior art. Therefore, herein, the operation upon data writing which is largely different from the prior art is mainly described.

At time t1, when the first reference clock $\overline{RAS}$ becomes low level to be in an active state, the write control signal $\overline{WE}$ is set to a low level, and the first $\overline{CAS}$ input is generated at time t4, and the data is written. At this time, since both data latch driving signal PE and write control signal $\overline{WE}$ are at a low level, the data line switch 21 shown in FIG. 1 and FIG. 2 is cut off, and the data lines DL1, $\overline{DL1}$ and DL1a, $\overline{DL1a}$ are separated. Accordingly, write data is transferred only to DL1a, $\overline{DL1a}$. At this time, since the internal write control signal W becomes a high level (active state), in the batch writing buffer 22 shown in FIG. 1 and FIG. 2, the data on the data lines (DL1a, $\overline{DL1a}$ to DL4a, $\overline{DL4a}$) to which buffers 23 to 26 are connected are latched in the buffers 23 to 24. In the buffer 23 on the data lines DL1a, $\overline{DL1a}$ in which data are written, the write data is directly latched, and in the other buffers 24 to 26, the read data being latched at time t3 are latched. In consequence, the write history detection circuit 28 in FIG. 4 is actuated, and the write history detection signal WFLG becomes a high level. Writing of data into the data lines $\overline{DL3a}$, DL3a to be done at the time of the third $\overline{CAS}$ input (time t8) is conducted similarly, and at this time, the write data is latched in the buffer 25 in FIG. 5. In this way, when all $\overline{CAS}$ cycles are over, at time t12, $\overline{RAS}$ becomes a high level to be in an inactive state. Here, since the data write action is done once or more during the active period of $\overline{RAS}$, the output signal WFLG of the write history detector 22 is at a high level. Thereby, the logic gate G19 and pulse generator 29 shown in FIG. 4 are actuated, and in a synchronism with the rise of $\overline{RAS}$, the batch writing buffer driving signal WA is activated to be in high level. When the batch writing buffer driving signal WA is set in an active state, the data line switch 21 shown in FIG. 1 and FIG. 2 is set in a conductive state, and the hitherto separated data lines are coupled with the memory cell array 5 which is the final target of data writing by way of the column decoder 7, sense amplifier 6, etc. Moreover, since the batch writing buffer 22 possesses a buffer function to drive the data lines at a low impedance, writing of data into the memory cell in the memory cell array 5 is realized here for the first time. Consequently, after passing of the necessary time for writing data generated by the clock generator 27 shown in FIG. 4, all operations are completed at time t13 (FIG. 5, FIG. 6).

Thus, according to this embodiment, in the circuit for realizing the nibble mode of a DRAM, the data line switch 21 for data line separation, and the batch writing buffer 22 for temporarily latching the write data transferred to the data lines at the time of data writing in every $\overline{CAS}$ cycle and operating as the buffer for batch transfer to the data to the selected memory cells are disposed on data lines, and furthermore the write history detector for detecting and storing the data write cycles within a series of $\overline{CAS}$ cycles, and the circuit for driving the data batch writing buffer in synchronism with the inactivation of the $\overline{RAS}$ clock on the basis of the result of its detection are also provided. By thus composing, as compared with the system of writing data up to the memory cells at every $\overline{CAS}$ cycle of the nibble mode in the conventional circuit, the writing time in every $\overline{CAS}$ cycle is markedly shortened, and the total writing time is shortened by batch writing of data into memory cells.

In the foregoing embodiment of the invention, incidentally, an example of a nibble mode of a DRAM is illustrated, but, needless to say, the invention may be equally applied to other similar high speed modes, such as the byte mode or serial mode.

Figure 7:
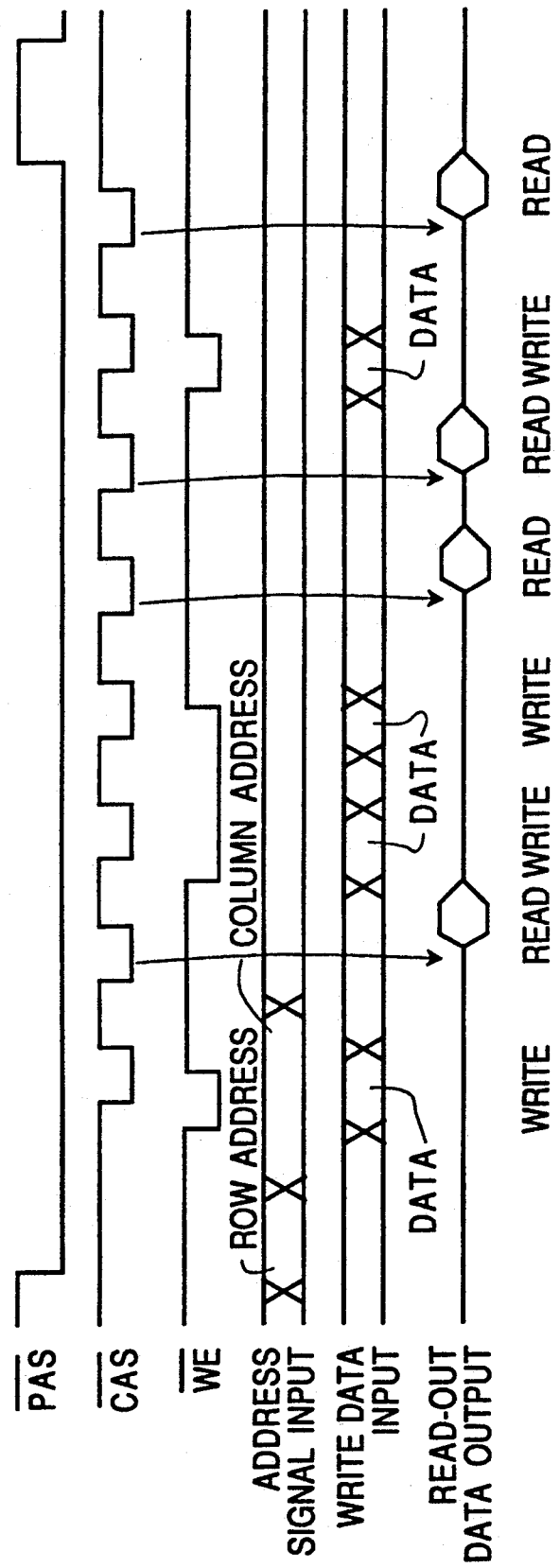
FIG. 7 shows voltage waveform diagrams explaining the operation of another embodiment of the present invention.

FIG. 7 shows voltage waveforms of principal nodes in the byte mode.

The basic composition of the byte mode is similar to that of the first embodiment, and its operation is the same as in the first embodiment, in principle. The distinction is that the byte mode handles data in an 8-bit unit, while the nibble mode handles data in a 4-bit unit. Therefore, as shown in FIG. 7, $\overline{CAS}$ is entered 8 times within the active period of $\overline{RAS}$. In FIG. 7, data is written by the 1st, 3rd, 4th and 7th $\overline{CAS}$ inputs, and the data is read out by the 2nd, 5th, 6th and 8th inputs.

When applying the invention in such a byte-mode semiconductor memory device, eight latch circuits corresponding to eight bits are provided as the data latch 8 shown in FIG. 1 and FIG. 2.

On the other hand, the serial mode (also known as extended nibble mode), is basically similar in composition and operation to the nibble mode of the first embodiment. However, while the nibble mode handles data in 4-bit unit, the serial model handles data in the row unit of the memory address space, generally (for example, 64 bits, 256 bits, 1k bite, 2k bits, etc.). Therefore, as the data latch 8 shown in FIG. 1 and FIG. 2, as many latch circuits are provided as the number corresponding to the row unit in the memory address space (in the examples above, 64, 256, 1000, 2000, etc.).

Although the timing chart of the serial mode is not shown, there are 64, 256 or other $\overline{CAS}$ inputs within the active period of $\overline{RAS}$ shown in FIG. 7, and the data is written and read out in synchronism with each $\overline{CAS}$ input.

We claim:

1. A semiconductor memory device comprising:
   a memory cell array having plural memory cells disposed in an array;
   selecting means for selecting a plurality of memory cells from among said plural memory cells of said memory cell array;
   a plurality of data lines coupled to said selecting means, each of said plurality of data lines for transmitting write data to and read data from said memory cell array;
   a read data latch means, having a plurality of latch circuits respectively coupled to said plurality of data lines, for temporarily storing data therein; and,
   a write data latch means, having a plurality of buffer circuits respectively coupled to said plurality of data lines, for temporarily storing data therein;
   wherein, upon carrying out a write operation for writing of the write data into said memory cell array, the write data is stored in both said read data latch means and said write data latch means at the same time.

2. A semiconductor memory device as recited in claim 1, further comprising means for transmitting in a batch operation the write data stored in said write data latch means to said memory cell array.

3. A semiconductor memory device as recited in claim 2, further comprising means for storing the read data in said read data latch means and for sequentially reading the read data stored in said read data latch means.

4. A semiconductor memory device as recited in claim 2, further comprising a write history detecting means for storing write history information indicative of a write operation of said write data latch means.

5. A semiconductor memory device as recited in claim 4, further comprising means for generating a write control signal responsive to the write history information stored in said write history detecting means, wherein the batch operation is carried out responsive to the write control signal.

6. A semiconductor memory device as recited in claim 5, wherein said write history detecting means includes a single stage of latch circuits.

7. A semiconductor memory device as recited in claim 6, further comprising a selector circuit coupled to said plurality of data lines.

8. A semiconductor memory device as recited in claim 4, wherein said write history detecting means includes a single stage of latch circuits.

9. A semiconductor memory device as recited in claim 5, further comprising means for transmitting data from each of said plurality of latch circuits of said read data latch means to an associated one of said plurality of buffer circuits of said write data latch means in which corresponding data have not been stored.

10. A semiconductor memory device as recited in claim 9, further comprising a selector circuit coupled to said plurality of data lines.

11. A semiconductor memory device as recited in claim 2, further comprising a selector circuit coupled to said plurality of data lines.

12. A semiconductor memory device as recited in claim 2, further comprising means for transmitting data from each of said plurality of latch circuits of said read data latch means to an associated one of said plurality of buffer circuits of said write data latch means in which corresponding data have not been stored.

13. A semiconductor memory device as recited in claim 1, further comprising means for storing the read data in said read data latch means and for sequentially reading the read data stored in said read data latch means.

14. A semiconductor memory device as recited in claim 1, further comprising a write history detecting means for storing write history information indicative of a write operation of said write data latch means.

15. A semiconductor memory device as recited in claim 14, wherein said write history detecting means includes a single stage of latch circuits.

16. A semiconductor memory device as recited in claim 14, further comprising means for transmitting data from each of said plurality of latch circuits of said read data latch means to an associated one of said plurality of buffer circuits of said write data latch means in which corresponding data have not been stored.

17. A semiconductor memory device as recited in claim 1, further comprising means for transmitting data from each of said plurality of latch circuits of said read data latch means to an associated one of said plurality of buffer circuits of said write data latch means in which corresponding data have not been stored.

18. A semiconductor memory device as recited in claim 1, wherein a number of said plurality of buffer circuits and a number of said plurality of latch circuits is the same and is one of four and eight.

19. A semiconductor memory device as recited in claim 1, wherein a number of said plurality of buffer circuits and a number of said plurality of latch circuits is the same and corresponds to a number of bits in a row unit of a memory address space of said memory cell array.

20. A semiconductor memory device as recited in claim 1, further comprising a selector circuit coupled to said plurality of data lines.

* * * * *